(12) United States Patent
Uchida

(10) Patent No.: US 6,437,446 B1
(45) Date of Patent: Aug. 20, 2002

(54) SEMICONDUCTOR DEVICE HAVING FIRST AND SECOND CHIPS

(75) Inventor: Yasufumi Uchida, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/527,217

(22) Filed: Mar. 16, 2000

(51) Int. Cl.⁷ .............................................. H01L 29/40
(52) U.S. Cl. ...................................... 257/777; 257/723
(58) Field of Search ................................. 257/697, 777, 257/778, 723

(56) References Cited

U.S. PATENT DOCUMENTS 5,471,369 A * 11/1995 Honda et al. ............... 257/778
5,767,528 A * 6/1998 Sumi et al. .................... 257/48
6,031,284 A * 2/2000 Song ............................ 257/701
6,291,267 B1 * 9/2001 Dore et al. ................. 438/108

* cited by examiner

Primary Examiner—Roy Potter
(74) Attorney, Agent, or Firm—Rabin & Berdo, P.C.

(57) ABSTRACT

A semiconductor device includes a substrate (101); a first semiconductor chip (102) mounted on the substrate; and a first insulating layer (105) which is provided on the first semiconductor chip. The device further includes a metal layer (102) which is provided on the first insulating layer; a second insulating layer (117) which is provided on the metal layer; and a second semiconductor chip (104) which is provided on the second insulating layer.

20 Claims, 12 Drawing Sheets

SEMICONDUCTOR DEVICE HAVING FIRST AND SECOND CHIPS

TECHNICAL FIELD OF THE INVENTION

The present invention generally relates to a semiconductor device and a method for fabricating the same. More particularly, the present invention relates to a MCP (Multi Chip Package) type of semiconductor device, which includes a plurality of semiconductor chips therein.

BACKGROUND OF THE INVENTION

Recently, for improving the integration of semiconductor ICs, MCP (Multi Chip Package) technology has been used. A conventional semiconductor device is made up of a substrate, a first semiconductor chip mounted on the substrate and a -second semiconductor chip provided on the first semiconductor chip. Those semiconductor chips are resin-molded to form a semiconductor package. The complete semiconductor package is mounted on a mother board using, for example, BGA (Ball Grid Array) technique.

The first and second semiconductor chips are provided with aluminum electrodes thereon, while the substrate is provided with bonding posts. The aluminum electrodes of the semiconductor chips and bonding posts on the substrate are wire-bonded to make electrical connection.

The second semiconductor chip must be small enough in order to form the areas for the aluminum electrodes on the first semiconductor chip. If the second semiconductor chip is too small as compared to the first semiconductor chip, the metal wires must be long and therefore it is difficult to keep the metal wires in good shape. On the other hand, if the second semiconductor chip is not small enough, a short circuit may be made between the first and second semiconductor chips. Therefore, it is required that the semiconductor chips are designed in shape with many restrictions. At the same time, it has been required to design semiconductor devices (IC packages) to be thinner.

In addition, according to the conventional semiconductor device, when the first and second semiconductor chips are operating at the same time, signals interfere with each other between the first and second semiconductor chips. As a result, the semiconductor device may not operate properly.

OBJECTS OF THE INVENTION

Accordingly, an object of the present invention is to provide a semiconductor device in which no signal interference is made between semiconductor chips.

Another object of the present invention is to provide a semiconductor device in which semiconductor chips can be designed without many restrictions in shape.

Still another object of the present invention is to provide a semiconductor device that can be designed to be small in size or thinner.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a generic aspect of the present invention, a semiconductor device is made up of a substrate (101, 201, 301, 401, 501, 601 or 701); a first semiconductor chip (102, 202, 302, 402, 502, 602 or 702) mounted on the substrate; a first insulating layer (105, 205, 305, 405, 505, 605 or 705) which is provided on the first semiconductor chip; a metal layer (102, 202, 302, 402, 502, 602 or 702) which is provided on the first insulating layer; a second insulating layer (117, 217, 317, 417, 517, 617 or 717) which is provided on the metal layer; and a second semiconductor chip (104, 204, 304, 404, 504, 604 or 704) which is provided on the second insulating layer.

In the above described semiconductor device, the metal layer electro-magnetically interrupts or reduce an interruption of signals, which are generated between the first and second semiconductor chips. As a result, the semiconductor device operates properly and the quality and reliability is improved.

According to a first specific aspect of the present invention, a semiconductor device is made up of a substrate (101); a first insulating layer (103) which is provided on the substrate; a first semiconductor chip (102) which is provided on the first insulating layer; a second insulating layer (105) which is provided on the first semiconductor chip; a metal layer (112) which is provided on the second insulating layer; a third insulating layer (117) which is provided on the metal layer; and a second semiconductor chip (104) which is provided on the third insulating layer.

According to a second specific aspect of the present invention, a semiconductor device includes a substrate (301, 401, 501, 601 or 701) which is shaped to have a cavity (322, 422, 522, 622 or 722); a first semiconductor chip (302, 402, 502, 602 or 702) which is mounted in the cavity of the substrate; a first insulating layer (305, 405, 505, 605 or 705) which is provided on the first semiconductor chip; a metal layer (312, 412, 512, 612 or 712) which is provided on the first insulating layer; a second insulating layer (317, 417, 517, 617 or 717) which is provided on the metal layer; and a second semiconductor chip (304, 404, 504, 604 or 704) which is provided on the second insulating layer.

In the above described semiconductor device, the first semiconductor chip is mounted in the cavity of the substrate, so that the semiconductor device can be fabricated to be thinner. Further, the first semiconductor chip may be mounted by surface bonding and wire bonding is only performed between the second semiconductor chip and the substrate. Therefore, a short circuit is not easily made between the first and second semiconductor chips.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
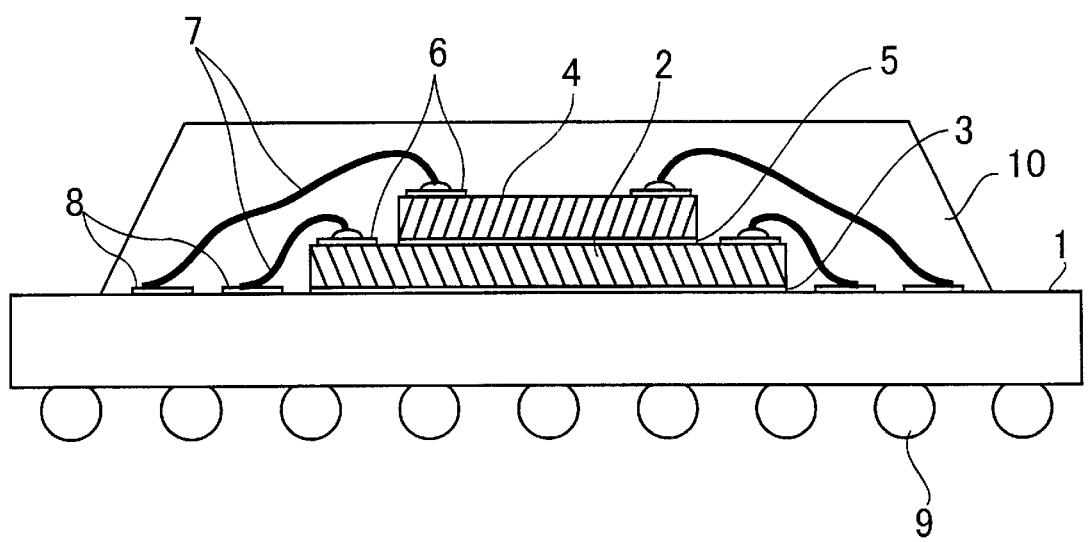
FIG. 1 is a cross-sectional view illustrating a MCP (Multi Chip Package) type of conventional semiconductor device.

For better understanding of the present invention, a conventional technology is first described. FIG. 1 shows a BGA (Ball Grid Array) type of conventional MCP (Multi Chip Package) semiconductor device. The semiconductor device includes a substrate 1, which is provided at the bottom surface with solder balls 9. The substrate 1 may be an organic substrate, such as glass epoxy resin. The substrate 1 is to be mounted on a motherboard, not shown, with the solder balls 9.

The semiconductor device further includes a first semiconductor chip 2 and a second semiconductor chip 4. Those semiconductor chips 2 and 4 may be a pair of CMOS and SOI types semiconductor chips; analog and digital types of semiconductor chips; or chips that are fabricated according to the different process rules. For example, the first semiconductor chip 2 is a modem and the second semiconductor chip 4 is a microcomputer chip, which controls the modem. In general, modems tend to generate a large amount of noise.

The first semiconductor chip 2 is adhered onto the substrate 1 with a first insulating adhesive layer 3. The second semiconductor chip 4 is adhered onto the first semiconductor chip 2 with a second insulating adhesive layer 3. The substrate 1 is provided at the upper surface with bonding posts 8. The first and second semiconductor chips 2 and 4 are provided with aluminum electrodes 6. The aluminum electrodes 6 of the first and second semiconductor chips 2 and 4 are connected to the bonding posts 8 of the substrate 1 with metal wires 7 in a wire bonding process.

The first and second semiconductor chips 2 and 4 are covered and sealed with a mold resin 10. The first and second insulating adhesive materials 3 and 5 prevent the first semiconductor chip 2 and conductive lines formed on the substrate 1 from generating a short circuit therein. The first and second insulating adhesive materials 3 and 5 may be epoxy resin or polyimide resin.

According to the conventional semiconductor device, the second semiconductor chip 4 must be small enough in order to form areas for the aluminum electrodes 6 on the first semiconductor chip 2. If the second semiconductor chip 4 is too small as compared to the first semiconductor chip 2, the metal wires 7 must be long and therefore it is difficult to keep the metal wires 7 in good shape. On the other hand, if the second semiconductor chip 4 is not small enough, a short circuit may be made between the first and second semiconductor chips 2 and 4. This means that the designs of the semiconductor chips 2 and 4, which are to be contained in a single package, are restricted very much.

In addition, according to the conventional semiconductor device, when the first and second semiconductor chips 2 and 4 are operating at the same time, signals interfere with each other between the first and second semiconductor chips 2 and 4. As a result, the semiconductor device may not operate properly.

(1) First Preferred Embodiment

Figure 2:
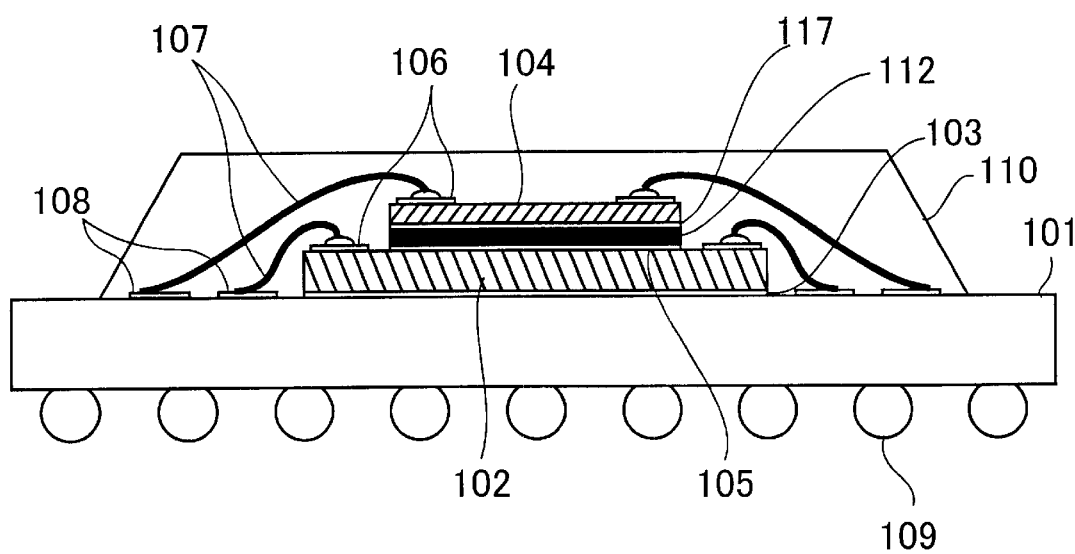
FIG. 2 is a cross-sectional view illustrating a MCP (Multi Chip Package) type of semiconductor device according to a first preferred embodiment of the present invention.

FIG. 2 shows a BGA (Ball Grid Array) type of MCP (Multi Chip Package) semiconductor device according to a first preferred embodiment of the present invention. The semiconductor device is preferably made up of a substrate 101, which is provided at the bottom surface with solder balls 109. The substrate 101 may be an organic substrate, such as glass epoxy resin. The substrate 101 is to be mounted on a motherboard, not shown, with the solder balls 109.

The semiconductor. device further is made up of a first semiconductor chip 102 and a second semiconductor chip 104. The number of semiconductor chips contained in the semiconductor device is not limited. Those semiconductor chips 102 and 104 may be a pair of CMOS and SOI types semiconductor chips; analog and digital types of semiconductor chips; or chips that are fabricated according to the different process rules. For example, the first semiconductor chip 102 is a modem and the second semiconductor chip 104 is a microcomputer chip, which controls the modem. In general, modems tend to generate a large amount of noise, which should be reduced or deleted.

The semiconductor device is made up of a metal layer 112 that is arranged between the first and second semiconductor chips 102 and 104. The metal layer is shaped to be a film or plate, which is made of a material selected from copper, aluminum, gold, iron and alloys thereof.

The first semiconductor chip 102 is adhered onto the substrate 101 with a first insulating adhesive layer 103. The metal layer 112 is adhered onto the first semiconductor chip 102 with a second insulating adhesive layer 105. The second semiconductor chip 104 is adhered onto the metal layer 112 with a third insulating adhesive layer 117. The substrate 101 is provided at the upper surface with bonding posts 108. The first and second semiconductor chips 102 and 104 are provided with aluminum electrodes 106. The aluminum electrodes 106 of the first and second semiconductor chips 102 and 104 are connected to the bonding posts 108 of the substrate 101 with metal wires 107 in a wire bonding process.

The first and second semiconductor chips 102 and 104 are covered and sealed with a mold resin 110. The first to third insulating adhesive materials 103, 105 and 117 prevent a short circuit from being generated in the semiconductor device. The first to third insulating adhesive materials 103, 105 and 117 may be epoxy resin or polyimide resin. The mold resin 110 may be an epoxy resin.

The second semiconductor chip 104 is shaped to be smaller than the first semiconductor chip 102. The metal layer 112 is shaped to have an area corresponding to the bottom surface area of the second semiconductor chip 104. In other words, the metal layer 112 and second semiconductor chip 104 are shaped to have the same size in a plane view.

According to the above described semiconductor device, the metal layer 112 electro-magnetically interrupts or reduces an interruption (noise) of signals, which go up and down between the first and second semiconductor chips 102 and 104. In other words, the metal layer 112 shuts off noise generated in the semiconductor chips 102 and 104. As a result, the semiconductor device operates properly and the quality and reliability is improved.

Figure 3A:
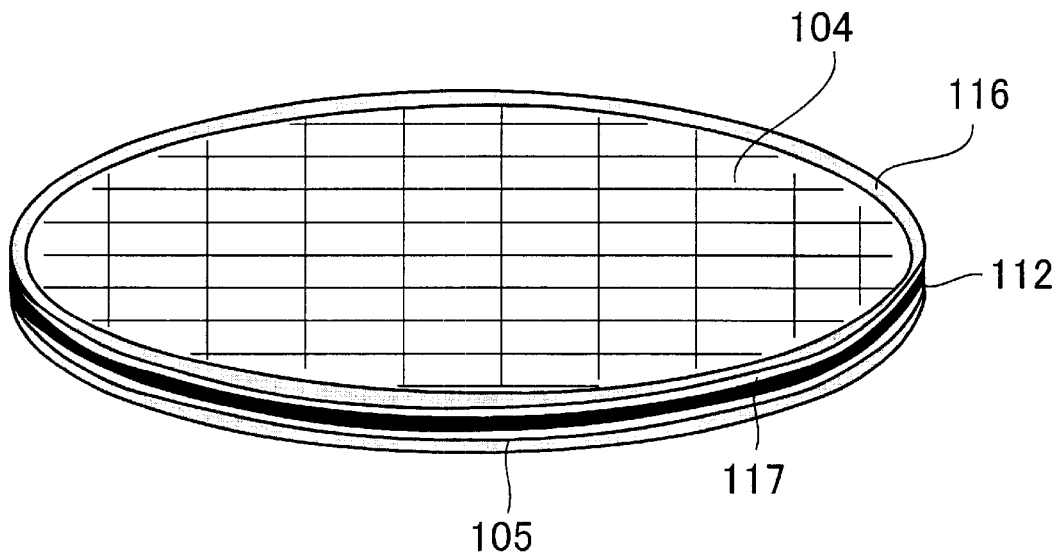
FIG. 3A is a perspective view showing a wafer used for fabricating the semiconductor device shown in FIG. 2.
Figure 3B:
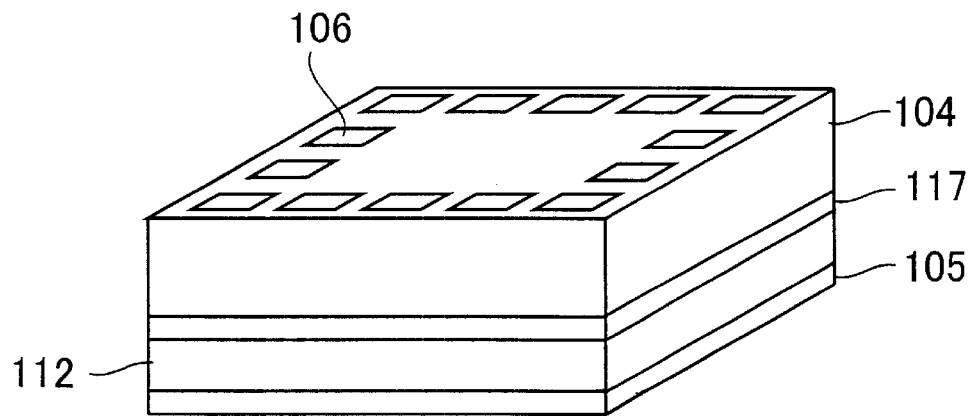
FIG. 3B is a perspective view showing a part of the semiconductor device shown in FIG. 2, which is fabricated from the wafer shown in FIG. 3A.

FIG. 3A shows a wafer 116 used for fabricating the semiconductor device. In fabrication, the second and third insulating adhesive resin (105 and 117) is spread on the bottom and upper surfaces of a metal plate (112). Next, the wafer 116, including a plurality of the second semiconductor chips 104, is adhered onto the metal plate (112) with the insulating adhesive resin to form a structure shown in FIG. 3A. Next, the wafer structure, shown in FIG. 3A, is cut to form individual regions each including the second semiconductor chip 104, as shown in FIG. 3B. The structure, shown in FIG. 3B, is placed onto the first semiconductor chip 102. According to the above described method, the wafer 116 is cut together with the metal plate (112), so that the second semiconductor chip 104 and metal layer 112 are shaped to have the same size in plane view.

(2) Second Preferred Embodiment

Figure 4:
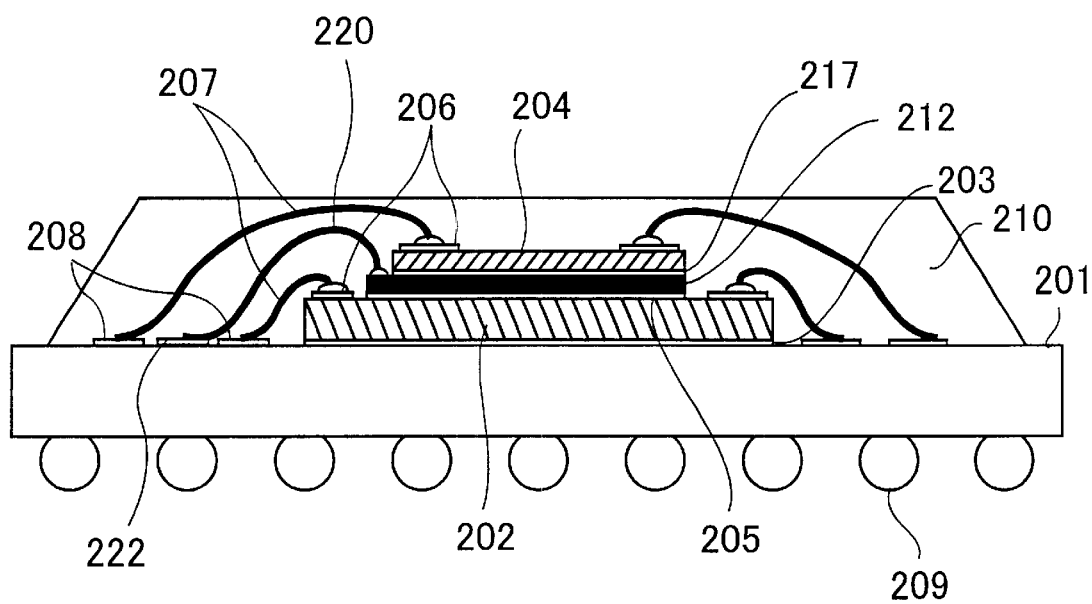
FIG. 4 is a cross-sectional view illustrating a MCP (Multi Chip Package) type of semiconductor device according to a second preferred embodiment of the present invention.

FIG. 4 shows a BGA (Ball Grid Array) type of MCP (Multi Chip Package) semiconductor device according to a second preferred embodiment of the present invention. The semiconductor device is preferably made up of a substrate 201, which is provided at the behind surface with solder balls 209. The substrate 201 may be an organic substrate, such as glass epoxy resin. The substrate 201 is to be mounted on a motherboard, not shown, with the solder balls 209.

The semiconductor device further includes a first semiconductor chip 202 and a second semiconductor chip 204. The number of semiconductor chips contained in the semiconductor device is not limited. Those semiconductor chips 202 and 204 may be a pair of CMOS and SOI types semiconductor chips; analog and digital types of semiconductor chips; or chips that are fabricated according to the different process rules. For example, the first semiconductor chip 202 is a modem and the second semiconductor chip 204 is a microcomputer chip, which controls the modem. In general, modems tend to generate a large amount of noise, which should be reduced or deleted.

The semiconductor device includes a metal layer 212 that is arranged between the first and second semiconductor chips 202 and 204. The metal layer is shaped to be a film or plate, which is made of a material selected from copper, aluminum, gold, iron and alloys thereof.

The first semiconductor chip 202 is adhered onto the substrate 201 with a first insulating adhesive layer 203. The metal layer 212 is adhered onto the first semiconductor chip 202 with a second insulating adhesive layer 205. The second semiconductor chip 204 is adhered onto the metal layer 212 with a third insulating adhesive layer 217. The substrate 201 is provided at the upper surface with bonding posts 208. The first and second semiconductor chips 202 and 204 are provided with aluminum electrodes 206. The aluminum electrodes 206 of the first and second semiconductor chips 202 and 204 are connected to the bonding posts 208 of the substrate 201 with metal wires 207 in a wire bonding process.

The substrate 201 is also provided at the top surface with a bonding post 222, which is connected to the metal layer 212 via a metal wire 220. The metal layer 212 is electrically grounded through the metal wire 220 and bonding post 222, so that undesirable signal noise are shut off more reliably and stably.

The first and second semiconductor chips 202 and 204 are covered and sealed with a mold resin 210. The first to third insulating adhesive materials 203, 205 and 217 prevent a short circuit from being generated in the semiconductor device. The first to third insulating adhesive materials 203, 205 and 217 may be epoxy resin or polyimide resin. The mold resin 210 may be an epoxy resin.

The second semiconductor chip 204 is shaped to be smaller than the first semiconductor chip 202. The metal layer 212 is shaped to have an area corresponding to the behind surface area of the second semiconductor chip 204. In other words, the metal layer 212 and second semiconductor chip 204 are shaped to have the same size in a plane view.

According to the above described semiconductor device, the metal layer 212 electro-magnetically interrupts or reduces an interruption (noise) of signals, which go up and down between the first and second semiconductor chips 202 and 204. In other words, the metal layer 212 shuts off noise generated in the semiconductor chips 202 and 204. As a result, the semiconductor device operates properly and the quality and reliability is improved.

The semiconductor device, shown in FIG. 4, can be fabricated in the same manner as the first preferred embodiment.

(3) Third Preferred Embodiment

Figure 5:
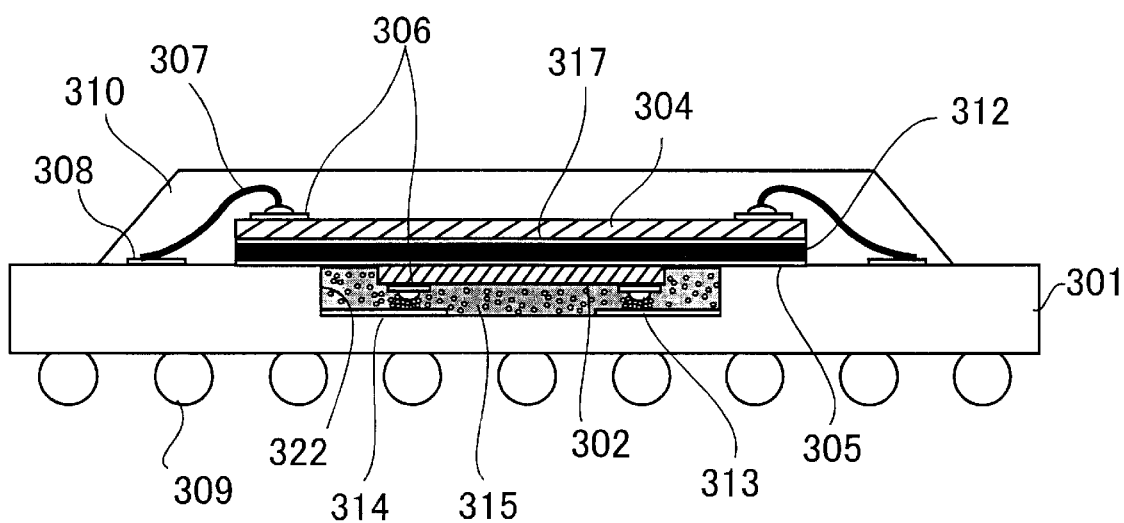
FIG. 5 is a cross-sectional view illustrating a MCP (Multi Chip Package) type of semiconductor device according to a third preferred embodiment of the present invention.

FIG. 5 shows a BGA (Ball Grid Array) type of MCP (Multi Chip Package) semiconductor device according to a third preferred embodiment of the present invention. The semiconductor device is preferably made up of a substrate 301, which is provided at the behind surface with solder balls 309. The substrate 301 may be an organic substrate, such as glass epoxy resin. The substrate 301 is to be mounted on a motherboard, not shown, with the solder balls 309. The substrate 301 is provided with a cavity (or depressed region) 322, in which metal terminals 314 are extending inwardly at the bottom.

The semiconductor device further includes a first semiconductor chip 302 and a second semiconductor chip 304. The number of semiconductor chips contained in the semiconductor device is not limited. Those semiconductor chips 302 and 304 may be a pair of CMOS and SOI types semiconductor chips; analog and digital types of semiconductor chips; or chips that are fabricated according to the different process rules.

The first semiconductor chip 302 is arranged in the cavity 322 of the substrate 301 so as that a surface, on which circuitry is arranged, faces down toward the bottom of the cavity 322. The first semiconductor chip 302 is provided at the circuitry surface with aluminum electrodes 306 with metal bumps 313 to be electrically connected to the metal terminals 314. The cavity 322 is filled up with an anisotropic conductive resin 315, such as ACF. The metal bumps 313 of the first semiconductor chip 302 are electrically connected to the metal terminals 314 through the anisotropic conductive resin 315 in the cavity 322. The anisotropic conductive resin 315 is a kind of resin which contains conductive spheres, its electrical resistance decreases when it is compressed.

The first semiconductor chip 302 is completely accommodated in the cavity 322. In other words, the top surface of the semiconductor chip 302 is in the same level as that of the substrate 301. The second semiconductor chip 304 is designed to be larger than the first semiconductor chip 302.

The semiconductor device further includes a metal layer 312 that is arranged between the first and second semiconductor chips 302 and 304. The metal layer 312 is shaped to be a film or plate, which is made of a material selected from copper, aluminum, gold, iron and alloys thereof The metal layer 312 is shaped and arranged so as to cover up the cavity 322 of the substrate 301.

The metal layer 312 is adhered onto the first semiconductor chip 302 with a first insulating adhesive layer 305. The second semiconductor chip 304 is adhered onto the metal layer 312 with a second insulating adhesive layer 317. The substrate 301 is provided at the upper surface with bonding posts 308. The second semiconductor chip 304 is provided with aluminum electrodes 306. The aluminum electrodes 306 of the second semiconductor chip 304 are connected to the bonding posts 308 of the substrate 301 with metal wires 307 in a wire bonding process.

In the same manner as the second preferred embodiment, the metal layer 312 may be grounded.

The first and second semiconductor chips 302 and 304 are covered and sealed with a mold resin 310. The first and second insulating adhesive layers. 305 and 317 prevent a short circuit from being generated in the semiconductor device. The first and second insulating adhesive materials 305 and 317 may be epoxy resin or polyimide resin. The mold resin 310 may be an epoxy resin.

The second semiconductor chip 304 is shaped to be larger than the first semiconductor chip 302. The metal layer 312 is shaped to have an area corresponding to the behind surface area of the second semiconductor chip 304. In other words, the metal layer 312 and second semiconductor chip 304 are shaped to have the same size in a plane view. The metal layer 312, first and second insulating adhesive layers 305 and 317, and the second semiconductor chip 304 may be fabricated or assembled in the same manner as the first preferred embodiment, shown in FIGS. 3A and 3B.

According to the above described semiconductor device, the metal layer 312 electro-magnetically interrupts or reduces an interruption (noise) of signals, which go up and down between the first and second semiconductor chips 302 and 304. In other words, the metal layer 312 shuts off noise generated in the semiconductor chips 302 and 304. As a result, the semiconductor device operates properly and the quality and reliability is improved.

Further, according to the third preferred embodiment of the present invention, no short circuit is made with metal wires, because only the second semiconductor chip 304 is mounted using metal wires 307. The first semiconductor chip 302 is placed in the cavity 322, so that the semiconductor package (310) can be fabricated to have a low height. The second semiconductor chip 304 is not required to be shaped smaller than the first semiconductor chip 302, so that the degree of freedom for designing the semiconductor chips 302 and 304 is improved. As a result, a wide variety of kinds of semiconductor chips can be contained in a single package.

In addition, the metal layer 312 is designed and arranged to cover up the cavity 322, so that the area for shutting off signal noise is increased. And therefore, an interruption (noise) of signals is electro-magnetically interrupted or reduced reliably.

(4) Fourth Preferred Embodiment

Figure 6:
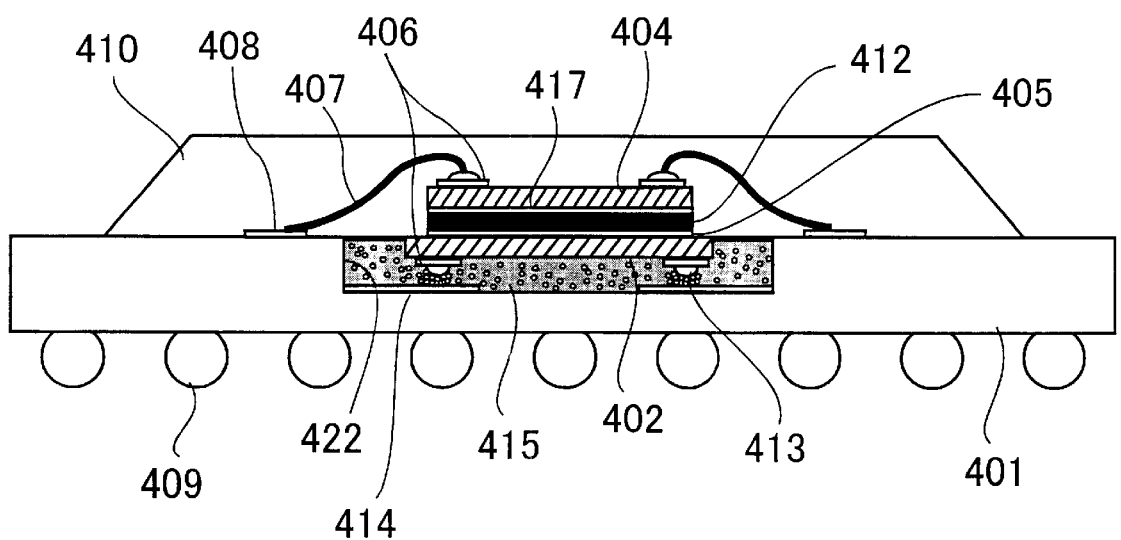
FIG. 6 is a cross-sectional view illustrating a MCP (Multi Chip Package) type of semiconductor device according to a fourth preferred embodiment of the present invention.

FIG. 6 shows a BGA (Ball Grid Array) type of MCP (Multi Chip Package) semiconductor device according to a fourth preferred embodiment of the present invention. The semiconductor device includes a substrate 401, which is provided at the behind surface with solder balls 409. The substrate 401 may be an organic substrate, such as glass epoxy resin. The substrate 401 is to be mounted on a motherboard, not shown, with the solder balls 409. The substrate 401 is provided with a cavity (or depressed region) 422, in which metal terminals 414 are extending inwardly at the bottom.

The semiconductor device further includes a first semiconductor chip 402 and a second semiconductor chip 404. The number of semiconductor chips contained in the semiconductor device is not limited. Those semiconductor chips 402 and 404 may be a pair of CMOS and SOI types semiconductor chips; analog and digital types of semiconductor chips; or chips that are fabricated according to the different process rules. For example, the first semiconductor chip 402 is a modem and the second semiconductor chip 404 is a microcomputer chip, which controls the modem. In general, modems tend to generate a large amount of noise, which should be reduced or deleted.

The first semiconductor chip 402 is arranged in the cavity 422 of the substrate 401 so as that a surface, on which circuitry is arranged, faces down toward the bottom of the cavity 422. The first semiconductor chip 402 is provided at the circuitry surface with aluminum electrodes 406 with metal bumps 413 to be electrically connected to the metal terminals 414. The cavity 422 is filled up with an anisotropic conductive resin 415, such as ACF. The metal bumps 413 of the first semiconductor chip 402 are electrically connected to the metal terminals 414 through the anisotropic conductive resin 415 in the cavity 422. The anisotropic conductive resin 415 is a kind of resin which contains conductive spheres, its electrical resistance decreases when it is compressed.

The first semiconductor chip 402 is completely accommodated in the cavity 422. In other words, the top surface of the first semiconductor chip 402 is in the same level as that of the substrate 401. The second semiconductor chip 404 is designed to be smaller than the first semiconductor chip 402.

The semiconductor device further includes a metal layer 412 that is arranged between the first and second semiconductor chips 402 and 404. The metal layer 412 is shaped to be a film or plate, which is made of a material selected from copper, aluminum, gold, iron and alloys thereof.

The metal layer 412 is adhered onto the first semiconductor chip 402 with a first insulating adhesive layer 405. The second semiconductor chip 404 is adhered onto the metal layer 412 with a second insulating adhesive layer 417. The substrate 401 is provided at the upper surface with bonding posts 408. The second semiconductor chip 404 is provided with aluminum electrodes 406.

The aluminum electrodes 406 of the second semiconductor chip 404 are connected to the bonding posts 408 of the substrate 401 with metal wires 407 in a wire bonding process.

In the same manner as the second preferred embodiment, the metal layer 412 may be electrically grounded.

The first and second semiconductor chips 402 and 404 are covered and sealed with a mold resin 410. The first and second insulating adhesive materials 405 and 417 prevent a short circuit from being generated in the semiconductor device. The first and second insulating adhesive materials 405 and 417 may be epoxy resin or polyimide resin. The mold resin 410 may be an epoxy resin.

The metal layer 412 is shaped to have an area corresponding to the behind surface area of the second semiconductor chip 404. In other words, the metal layer 412 and second semiconductor chip 404 are shaped to have the same size in a plane view. The metal layer 412, first and second insulating adhesive layers 405 and 417, and the second semiconductor chip 404 may be fabricated. or assembled in the same manner as the first preferred embodiment, shown in FIGS. 3A and 3B.

According to the above described semiconductor device, the metal layer 412 electro-magnetically interrupts or reduces an interruption (noise) of signals, which go up and down between the first and second semiconductor chips 402 and 404. In other words, the metal layer 412 shuts off noise generated in the semiconductor chips 402 and 404. As a result, the semiconductor device operates properly and the quality and reliability is improved.

Further, according to the fourth preferred embodiment of the present invention, no short circuit is made with metal wires, because only the second semiconductor chip 404 is mounted using metal wires 407. The first semiconductor chip 402 is placed or accommodated in the cavity 422, so that the semiconductor package (410) can be fabricated to have a lower height.

(5) Fifth Preferred Embodiment

Figure 7:
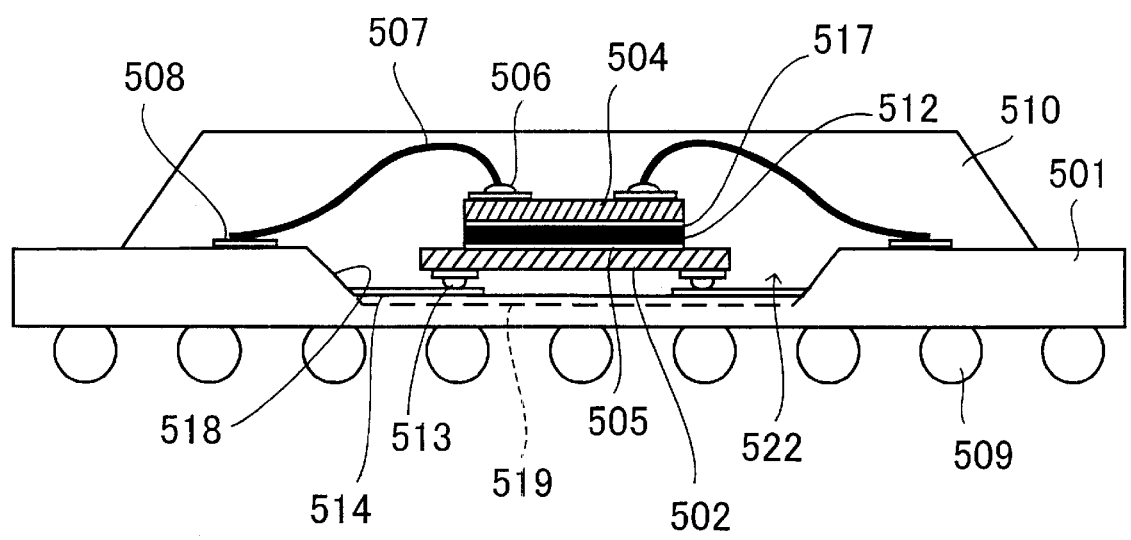
FIG. 7 is a cross-sectional view illustrating a MCP (Multi Chip Package) type of semiconductor device according to a fifth preferred embodiment of the present invention.

FIG. 7 shows a BGA (Ball Grid Array) type of MCP (Multi Chip Package) semiconductor device according to a fifth preferred embodiment of the present invention. The semiconductor device is preferably made up of a substrate 501, which is provided at the behind surface with solder balls 509. The substrate 501 may be an organic substrate, such as glass epoxy resin. The substrate 501 is to be mounted on a motherboard, not shown, with the solder balls 509. The substrate 501 is provided with a cavity (or depressed region) 522, in which metal terminals 514 are extending inwardly at the bottom.

The semiconductor device further includes a first semiconductor chip 502 and a second semiconductor chip 504. The number of semiconductor chips contained in the semiconductor device is not limited. Those semiconductor chips 502 and 504 may be a pair of CMOS and SOI types semiconductor chips; analog and digital types of semiconductor chips; or chips that are fabricated according to the different process rules. For example, the first semiconductor chip 502 is a modem and the second semiconductor chip 504 is a microcomputer chip, which controls the modem. In general, modems tend to generate a large amount of noise, which should be reduced or deleted.

The first semiconductor chip 502 is arranged in the cavity 522 of the substrate 501 so as that a surface, on which circuitry is arranged, faces down toward the bottom of the cavity 522. The first semiconductor chip 502 is provided at the circuitry surface with aluminum electrodes 506 with metal bumps 513 to be electrically connected to the metal terminals 514. The metal bumps 513 of the first semiconductor chip 502 are directly connected to the metal terminals.

Figure 8A:
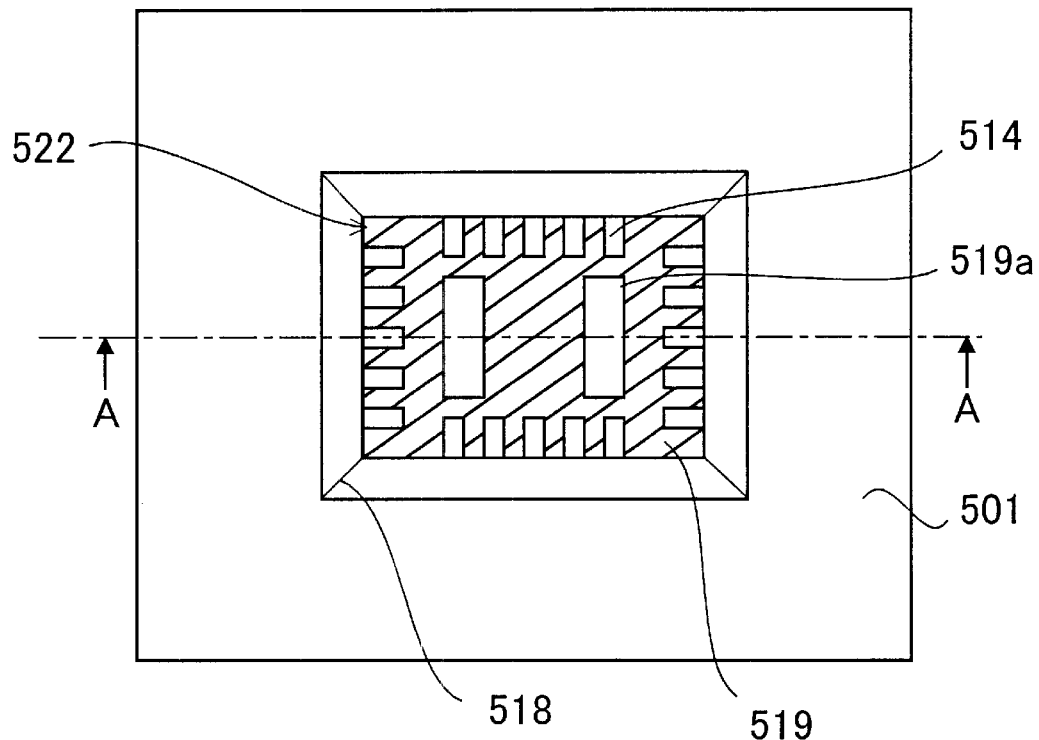
FIG. 8A is a plane view showing a part of the semiconductor device, shown in FIG. 7.
Figure 8B:
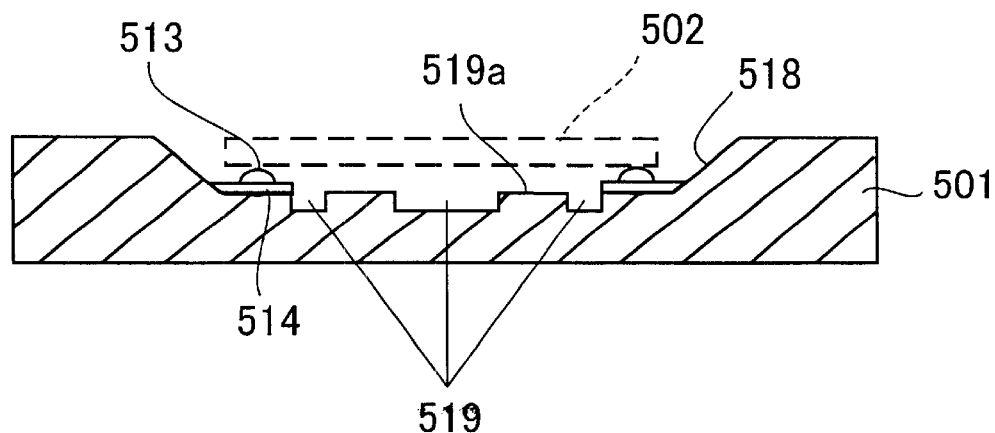
FIG. 8B is a cross-sectional view taken on line A—A in FIG. 8A.

The cavity 522 is shaped to have a tapered sidewall 518 so that a mold resin flows into the cavity 522 smoothly. The cavity 522 of the substrate 501 is provided at the bottom with depressed or lower region 519, so that the cavity 522 is easily filled up with a mold resin, as shown in FIGS. 8A and 8B.

The first semiconductor chip 502 is completely accommodated in the cavity 522. In other words, the top surface of the first semiconductor chip 502 is almost in the same level as that of the substrate 501. The second semiconductor chip 504 is designed to be smaller than the first semiconductor chip 502.

The semiconductor device further includes a metal layer 512 that is arranged between the first and second semiconductor chips 502 and 504. The metal layer 512 is shaped to be a film or plate, which is made of a material selected from copper, aluminum, gold, iron and alloys thereof.

The metal layer 512 is adhered onto the first semiconductor chip 502 with a first insulating adhesive layer 505. The second semiconductor chip 504 is adhered onto the metal layer 512 with a second insulating adhesive layer 517. The substrate 501 is provided at the upper surface with bonding posts 508. The second semiconductor chip 504 is provided with aluminum electrodes 506. The aluminum electrodes 506 of the second semiconductor chip 504 are connected to the bonding posts 508 of the substrate 501 with metal wires 507 in a wire bonding process.

In the same manner as the second preferred embodiment, the metal layer 512 may be electrically grounded.

The first and second semiconductor chips 502 and 504 are covered and sealed with a mold resin 510. The first and second insulating adhesive materials 505 and 517 prevent a short circuit from being generated in the semiconductor device. The first and second insulating adhesive materials 505 and 517 may be epoxy resin or polyimide resin. The mold resin 510 may be an epoxy resin.

The metal layer 512 is shaped to have an area corresponding to the behind surface area of the second semiconductor chip 504. In other words, the metal layer 512 and second semiconductor chip; 504 are shaped to have the same size in a plane view. The metal layer 512, first and second insulating adhesive layers 505 and 517, and the second semiconductor chip 504 may be fabricated or assembled in the same manner as the first preferred embodiment, shown in FIGS. 3A and 3B.

According to the above described semiconductor device, the metal layer 512 electro-magnetically interrupts or reduces an interruption (noise) of signals, which go up and down between the first and second semiconductor chips 502 and 504. In other words, the metal layer 512 shuts off noise generated in the semiconductor chips 502 and 504. As a result, the semiconductor device operates properly and the quality and reliability is improved.

Further, according to the fifth preferred embodiment of the present invention, no short circuit is made with metal wires, because only the second semiconductor chip 504 is mounted using metal wires 507. The first semiconductor chip 502 is placed or accommodated in the cavity 522, so that the semiconductor package (510) can be fabricated to have a lower height.

Furthermore, the mold resin 510 flows along the tapered sidewall 518 into the cavity 522 so that the region between the first semiconductor chip 502 and the bottom of the cavity 522 is first filled up with the mold resin 510. At the bottom of the cavity 522, the mold resin 510 first flows into the depressed region 519 then spreads out entirely. Therefore, the cavity 522 is filled up with the mold resin 510 effectively and reliably.

(6) Sixth Preferred Embodiment

Figure 9:
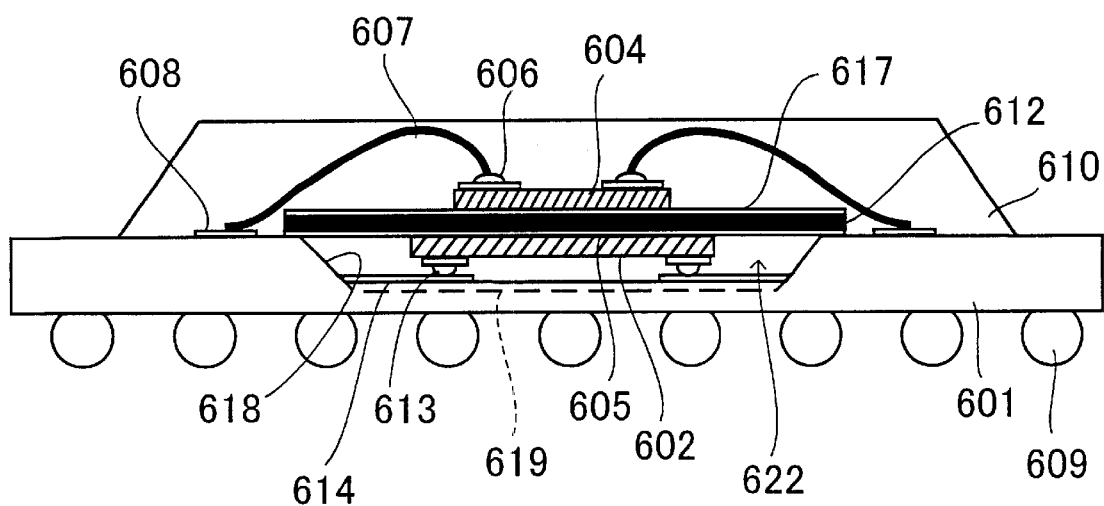
FIG. 9 is a cross-sectional view illustrating a MCP (Multi Chip Package) type of semiconductor device according to a sixth preferred embodiment of the present invention.

FIG. 9 shows a BGA (Ball Grid Array) type of MCP (Multi Chip Package) semiconductor device according to a sixth preferred embodiment of the present invention. The semiconductor device includes a substrate 601, which is provided at the behind surface with solder balls 609. The substrate 601 may be an organic substrate, such as glass epoxy resin. The substrate 601 is to be mounted on a motherboard, not shown, with the solder balls 609. The substrate 601 is provided with a cavity (or depressed region) 622, in which metal terminals 614 are extending inwardly at the bottom.

The semiconductor device further includes a first semiconductor chip 602 and a second semiconductor chip 604. The number of semiconductor chips contained in the semiconductor device is not limited. Those semiconductor chips 602 and 604 may be a pair of CMOS and SOI types semiconductor chips; analog and digital types of semiconductor chips; or chips that are fabricated according to the different process rules. For example, the first semiconductor chip 602 is a modem and the second semiconductor chip 604 is a microcomputer chip, which controls the modem. In general, modems tend to generate a large amount of noise, which should be reduced or deleted.

The first semiconductor chip 602 is arranged in the cavity 622 of the substrate 601 so as that a surface, on which circuitry is arranged, faces down toward the bottom of the cavity 622. The first semiconductor chip 602 is provided at the circuitry surface with aluminum electrodes 606 with metal bumps 613 to be electrically connected to the metal terminals 614. The metal bumps 613 of the first semiconductor chip 602 are directly connected to the metal terminals.

Figure 10A:
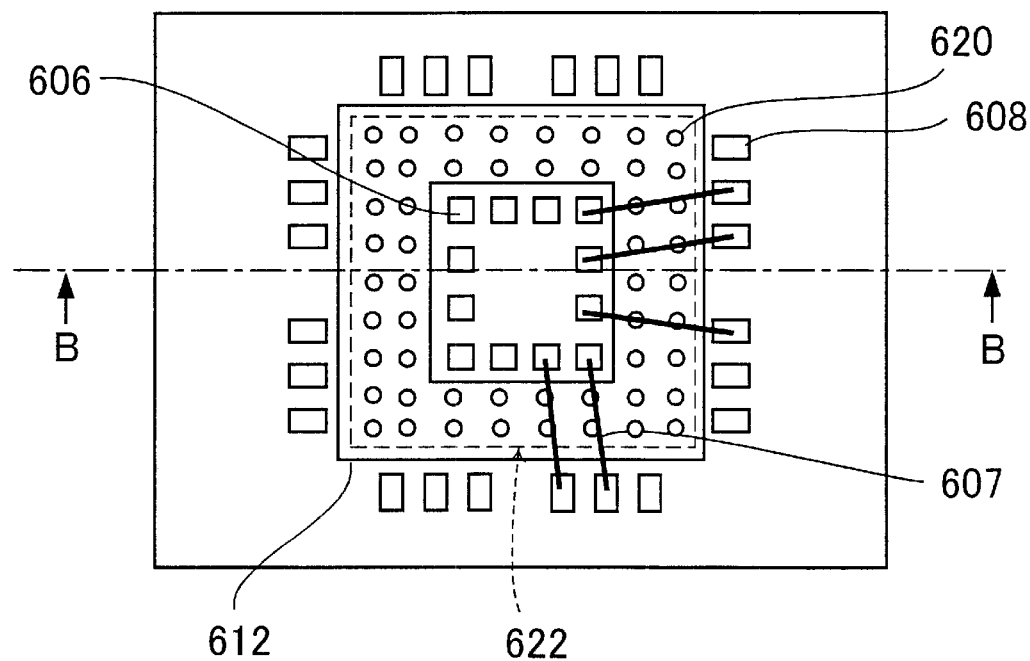
FIG. 10A is a plane view showing a part of the semiconductor device, shown in FIG. 9.
Figure 10B:
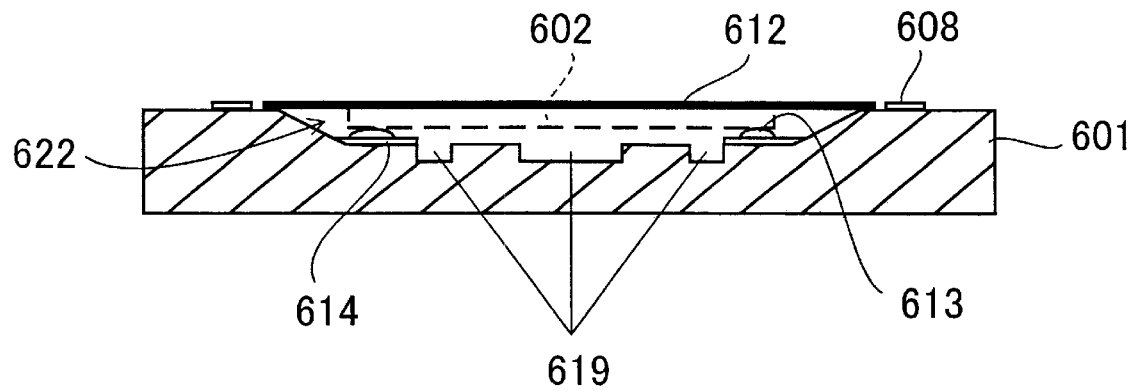
FIG. 10B is a cross-sectional view taken on line A—A in FIG. 10A.

The cavity 622 is shaped to have a tapered sidewall 618 so that a mold resin flows along it into the cavity 622 smoothly. The cavity 622 of the substrate 601 is provided at the bottom with depressed or lower region 619, so that the cavity 622 is easily filled up with a mold resin, as shown in FIG. 10B.

The first semiconductor chip 602 is completely accommodated in the cavity 622. In other words, the top surface of the first semiconductor chip 602 is in the same level as that of the substrate 601. The second semiconductor chip 604 is designed to be smaller than the first semiconductor chip 602.

The semiconductor device further includes a metal layer 612 that is arranged between the first and second semiconductor chips 602 and 604. The metal layer 612 is shaped to be a film or plate, which is made of a material selected from copper, aluminum, gold, iron and alloys thereof.

The metal layer 612 is adhered onto the first semiconductor chip 602 with a first insulating adhesive layer 605. The second semiconductor chip 604 is adhered onto the metal layer 612 with a second insulating adhesive layer 617. The substrate 601 is provided at the upper surface with bonding posts 608. The second semiconductor chip 604 is provided with aluminum electrodes 606. The aluminum electrodes 606 of the second semiconductor chip 604 are connected to the bonding posts 608 of the substrate 601 with metal wires 607 in a wire bonding process.

In the same manner as the second preferred embodiment, the metal layer 612 may be electrically grounded.

The first and second semiconductor chips 602 and 604 are covered and sealed with a mold resin 610. The first and second insulating adhesive materials 605 and 617 prevent a short circuit from being generated in the semiconductor device. The first and second insulating adhesive materials 605 and 617 may be epoxy resin or polyimide resin. The mold resin 610 may be an epoxy resin.

Figure 11:
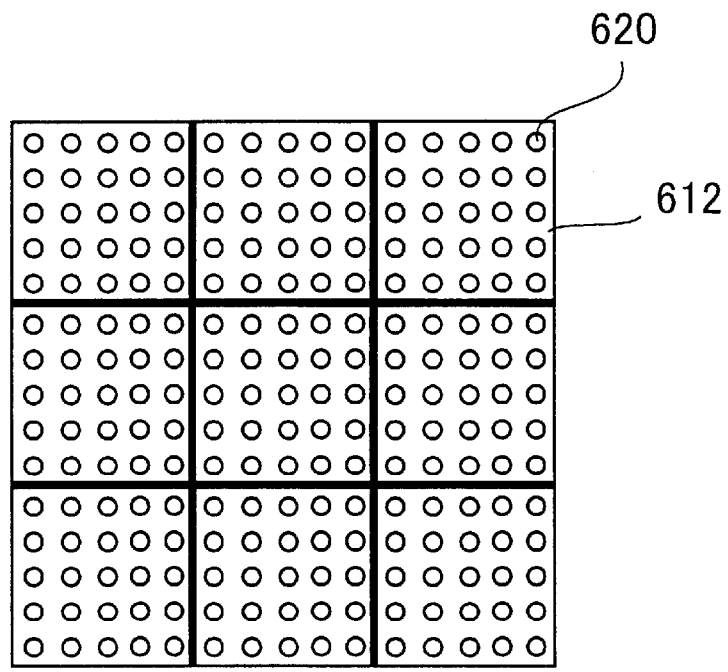
FIG. 11 is a plane view showing a metal layer used for the semiconductor device, shown in FIG. 9.

The metal layer 612 is shaped to be larger than the first and second semiconductor chips 602 and 604 in order to cover up the cavity 622 completely. As shown in FIGS. 10A and 11, the meal layer 612 is provide with a large number of holes 620 therein. so that the mold resin 610 flows them into the cavity 622.

According to the above described semiconductor device, the metal layer 612 electro-magnetically interrupts or reduces an interruption (noise) of signals, which go up and down between the first and second semiconductor chips 602 and 604. In other words, the metal layer 612 shuts off noise generated in the semiconductor chips 602 and 604. As a result, the semiconductor device operates properly and the quality and reliability is improved.

Further, according to the sixth preferred embodiment of the present invention, no short circuit is made with metal wires, because only the second semiconductor chip 604 is mounted using metal wires 607. The first semiconductor chip 602 is placed or accommodated in the cavity 622, so that the semiconductor package (610) can be fabricated to have a lower height.

Furthermore, the mold resin 610 flows along the tapered sidewall 618 into the cavity 622 so that the region between the first semiconductor chip 602 and the bottom of the cavity 622 is filled up with the mold resin 610 easily. At the bottom of the cavity 622, the mold resin 610 first flows into the depressed region 619 then spreads out entirely. Therefore, the cavity 622 is filled up with the mold resin 610 effectively and reliably.

In addition, the metal layer 612 is designed and arranged to cover up the cavity 622, so that the area for shutting off signal noise is increased. And therefore, an interruption (noise) of signals is electro-magnetically interrupted or reduced effectively and reliably.

Figure 12:
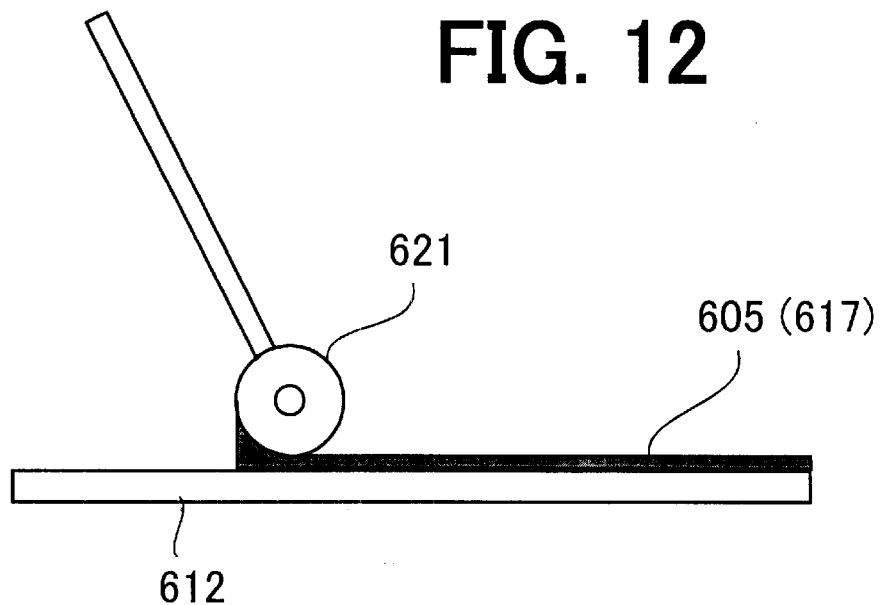
FIG. 12 is a diagram showing a fabrication step of the semiconductor device, shown in FIG. 9.

In fabrication, an insulating adhesive material (605, 617) is spread on the both surface of a metal plate (612) using a roller 621 to form the first and second insulating adhesive layers (605 and 617), as shown in FIG. 12. In this-process; the insulating adhesive material is not spread into the holes 620. After that, the metal plate is cut to form individual metal layers 612.

(7) Seventh Preferred Embodiment

Figure 13:
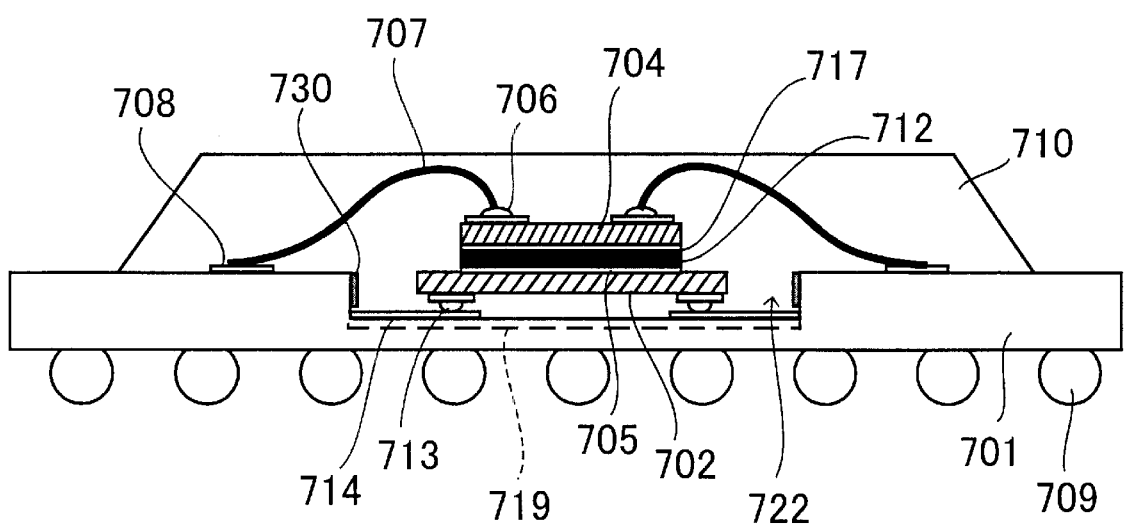
FIG. 13 is a cross-sectional view illustrating a MCP (Multi Chip Package) type of semiconductor device according to a seventh preferred embodiment of the present invention.

FIG. 13 shows a BGA (Ball Grid Array) type of MCP (Multi Chip Package) semiconductor device according to a seventh preferred embodiment of the present invention. The semiconductor device is preferably made up of a substrate 701, which is provided at the behind surface with solder balls 709. The substrate 701 may be an organic substrate, such as glass epoxy resin. The substrate 701 is to be mounted on a motherboard, not shown, with the solder balls 709. The substrate 701 is provided with a cavity (or depressed region) 722, in which metal terminals 714 are extending inwardly at the bottom.

The semiconductor device further includes a first semiconductor chip 702 and a second semiconductor chip 704. The number of semiconductor chips contained in the semiconductor device is not limited. Those semiconductor chips 702 and 704 may be a pair of CMOS and SOI types semiconductor chips; analog and digital types of semiconductor chips; or chips that are fabricated according to the different process rules. For example, the first semiconductor chip 702 is a modem and the second semiconductor chip 704 is a microcomputer chip, which controls the modem. In general, modems tend to generate a large amount of noise, which should be reduced or deleted.

The first semiconductor chip 702 is arranged in the cavity 722 of the substrate 701 so as that a surface, on which circuitry is arranged, faces down toward the bottom of the cavity 722. The first semiconductor chip 702 is provided at the circuitry surface with aluminum electrodes 706 with metal bumps 713 to be electrically connected to the metal terminals 714. The metal bumps 713 of the first semiconductor chip 702 are directly connected to the metal terminals.

The cavity 722 of the substrate 701 is provided at the bottom with depressed or lower region 719, so that the cavity 722 is easily filled up with a mold resin. The cavity 722 is provided at a side wall with a metal plate 730, which may be of a material selected from copper, aluminum, gold, iron and alloys thereof.

The first semiconductor chip 702 is completely accommodated in the cavity 722. In other words, the top surface of the first semiconductor chip 702 is almost in the same level as that of the substrate 701. The second semiconductor chip 704 is designed to be smaller than the first semiconductor chip 702.

The semiconductor device further includes a metal layer 712 that is arranged between the first and second semiconductor chips 702 and 704. The metal layer 712 is shaped to be a film or plate, which is made of a material selected from copper, aluminum, gold, iron and alloys thereof.

The metal layer 712 is adhered onto the first semiconductor chip 702 with a first insulating adhesive layer 705. The second semiconductor chip 704 is adhered onto the metal layer 712 with a second insulating adhesive layer 717. The substrate 701 is provided at the upper surface with bonding posts 708. The second semiconductor chip 704 is provided with aluminum electrodes 706. The aluminum electrodes 706 of the second semiconductor chip 704 are connected to the bonding posts 708 of the substrate 701 with metal wires 707 in a wire bonding process.

In the same manner as the second preferred embodiment, the metal layer 712 may be electrically grounded.

The first and second semiconductor chips 702 and 704 are covered and sealed with a mold resin 710. The first and second insulating adhesive materials 705 and 717 prevent a short circuit from being generated in the semiconductor device. The first and second insulating adhesive materials 705 and 717 may be epoxy resin or polyimide resin. The mold resin 710 may be an epoxy resin.

The metal layer 712 is shaped to have an area corresponding to the behind surface area of the second semiconductor chip 704. In other words, the metal layer 712 and second semiconductor chip 704 are shaped to have the same size in a plane view. The metal layer 712, first and second insulating adhesive layers 705 and 717, and the second semiconductor chip 704 may be fabricated or assembled in the same manner as the first preferred embodiment, shown in FIGS. 3A and 3B.

According to the above described semiconductor device, the metal layer 712 electro-magnetically interrupts or reduces an interruption (noise) of signals, which go up and down between the first and second semiconductor chips 702 and 704. In other words, the metal layer 712 shuts off noise generated in the semiconductor chips 702 and 704. As a result, the semiconductor device operates properly and the quality and reliability is improved. In addition, the metal plate 730 also functions for shutting off noise generated in the first semiconductor chip 702.

Further, according to the fifth preferred embodiment of the present invention, no short circuit is made with metal wires, because only the second semiconductor chip 704 is mounted using metal wires 707. The first semiconductor chip 702 is placed or accommodated in the cavity 722, so that the semiconductor package (710) can be fabricated to have a lower height.

At the bottom of the cavity 722, the mold resin 710 first flows into the depressed region 719 then spreads out entirely. Therefore, the cavity 722 is filled up with the mold resin 710 effectively and reliably.

What is claimed is:

1. A semiconductor device, which comprises:
   a substrate having first and second substantially parallel planar surfaces separated by a separation distance, the substrate having a cavity formed therein which extends from the first planar surface towards the second planar surface for at least part of the separation distance;
   a first semiconductor chip which is mounted in the cavity of the substrate;
   a first insulating layer which is provided on the first semiconductor chip;
   a metal layer which is provided on the first insulating layer;
   a second insulating layer which is provided on the metal layer; and
   a second semiconductor chip which is provided on the second insulating layer.

2. A semiconductor device according to claim 1, wherein the metal layer is made of a material selected from a group consisting of copper, aluminum, gold, iron and alloys thereof.

3. A semiconductor device according to claim 1, wherein the second semiconductor chip is designed to be larger than the first semiconductor chip.

4. A semiconductor device according to claim 3, wherein the metal layer is shaped to have the same size in plan view as that of the second semiconductor chip.

5. A semiconductor device according to claim 4, wherein the metal layer has an area covering up an upper opening of the cavity.

6. A semiconductor device according to claim 1, wherein
   the substrate is provided in the cavity with metal terminals;
   the first semiconductor chip is provided at a bottom thereof with metal bumps to be electrically connected to the metal terminals in the cavity, and
   the cavity is filled up with an anisotropic conductive resin through which the metal bumps are electrically connected to the metal terminals in the cavity.

7. A semiconductor device, which comprises:
   a substrate having first and second substantially parallel planar surfaces separated by a separation distance, the substrate having a cavity formed therein which extends from the first planar surface towards the second planar surface for at least part of the separation distance;
   metal terminals arranged in the cavity;
   a first semiconductor chip which is provided in the cavity, and is provided at a bottom thereof with metal bumps to be electrically connected to the metal terminals;
   a first insulating adhesive layer which is provided on the first semiconductor chip;
   a metal layer which is adhered onto the first semiconductor chip with the first insulating adhesive layer, and has an area covering up an upper opening of the cavity;
   a second insulating adhesive layer which is provided on the metal layer;
   a second semiconductor chip which is adhered on to the metal layer with the second insulating adhesive layer, and is shaped to be larger than the first semiconductor chip;
   an anisotropic conductive resin filling the cavity, through which the metal bumps of the first semiconductor chip are electrically connected to the metal terminals in the cavity;
   metal wires which electrically connect the second semiconductor chip to the substrate; and
   a mold resin which covers at least the second semiconductor chip, metal layer and the metal wires to make a mold package of the semiconductor device.

8. A semiconductor device according to claim 7, wherein the metal layer is made of a material selected from a group consisting of copper, aluminum, gold, iron and alloys thereof.

9. A semiconductor device according to claim 1, wherein the second semiconductor chip is designed not to be larger than the first semiconductor chip.

10. A semiconductor device according to claim 9, wherein the metal layer is shaped to have the same size in plan view as the second semiconductor chip.

11. A semiconductor device according to claim 1, further comprising a mold resin which fills up the cavity of the substrate and covers the first and second semiconductor chips to form a mold package of the semiconductor device.

12. A semiconductor device according to claim 11, wherein the cavity is shaped to have a tapered sidewall so that the opening area of the cavity is larger than a bottom thereof.

13. A semiconductor device according to claim 11, wherein the cavity is provided at a bottom thereof with a depressed region so that the cavity is filled up with the mold resin easily.

14. A semiconductor device according to claim 1, further comprising a mold resin which fills up the cavity and covers the first and second semiconductor chips to form a mold package of the semiconductor device, wherein the metal layer is arranged to cover up the cavity entirely.

15. A semiconductor device according to claim 14, wherein the metal layer is provided with a plurality of openings so that the mold resin runs into the cavity easily through the openings.

16. A semiconductor device according to claim 1, further comprising a metal film which is provided on a sidewall of the cavity.

17. A semiconductor device, which comprises:
a substrate having first and second substantially parallel planar surfaces separated by a separation distance, the substrate having a cavity formed therein which extends from the first planar surface towards the second planar surface for at least part of the separation distance;
metal terminals arranged in the cavity;
a first semiconductor chip which is provided in the cavity, and is provided at a bottom thereof with metal bumps to be electrically connected to the metal terminals;
a first insulating adhesive layer which is provided on the first semiconductor chip;
a metal layer which is adhered onto the first semiconductor chip with the first insulating adhesive layer;
a second insulating adhesive layer which is provided on the metal layer;
a second semiconductor chip which is adhered onto the metal layer with the second insulating adhesive layer, and is shaped not to be larger than the first semiconductor chip;
an anisotropic conductive resin filling the cavity of the substrate, through which the metal bumps of the first semiconductor chip are electrically connected to the metal terminals in the cavity;
metal wires which electrically connect the second semiconductor chip to the substrate; and
a mold resin which covers at least the second semiconductor chip, the metal layer and the metal wires to make a mold package of the semiconductor device.

18. A semiconductor device according to claim 17, wherein the metal layer is made of a material selected from a group consisting of copper, aluminum, gold, iron and alloys thereof.

19. A semiconductor device, which comprises:
a substrate having first and second substantially parallel planar surfaces separated by a separation distance, the substrate having a cavity formed therein which extends from the first planar surface towards the second planar surface for at least part of the separation distance, and the cavity having a tapered sidewall so that an opening area of the cavity is larger than a bottom thereof;
metal terminals arranged in the cavity;
a first semiconductor chip which is provided in the cavity, the first semiconductor chip having at the bottom thereof metal bumps to be electrically connected to the metal terminals;
a first insulating adhesive layer which is provided on the first semiconductor chip;
a metal layer which is adhered onto the first semiconductor chip with the first insulating adhesive layer;
a second insulating adhesive layer which is provided on the metal layer;
a second semiconductor chip which is adhered onto the metal layer with the second insulating adhesive layer, and is shaped not to be larger than the first semiconductor chip;
metal wires which electrically connect the second semiconductor chip to the substrate; and
a mold resin which fills up the cavity of the substrate and covers the first and second semiconductor chips to form a mold package of the semiconductor device, wherein the cavity is provided at the bottom thereof with a depressed region so that the cavity is filled up with the mold resin easily.

20. A semiconductor device, which comprises:
a substrate having first and second substantially parallel planar surfaces separated by a separation distance, the substrate having a cavity formed therein which extends from the first planar surface towards the second planar surface for at least part of the separation distance, and the cavity having a tapered sidewall so that an opening area of the cavity is larger than a bottom thereof;
metal terminals arranged in the cavity of the substrate;
a first semiconductor chip which is provided in the cavity, first semiconductor chip being provided at the bottom thereof with metal bumps to be electrically connected to the metal terminals;
a first insulating adhesive layer which is provided on the first semiconductor chip;
a metal layer which is adhered onto the first semiconductor chip with the first insulating adhesive layer to cover up the cavity entirely;
a second insulating adhesive layer which is provided on the metal layer;
a second semiconductor chip which is adhered onto the metal layer with the second insulating adhesive layer, and is shaped not to be larger than the first semiconductor chip;
metal wires which electrically connect the second semiconductor chip to the substrate; and
a mold resin which fills up the cavity of the substrate and covers the first and second semiconductor chips to form a mold package of the semiconductor device, wherein
the cavity is provided at the bottom thereof with a depressed region so that the cavity is filled up with the mold resin easily, and
the metal layer is provided with a plurality of openings so that the mold resin runs into the cavity easily through the openings.

* * * * *